(12) United States Patent
Bang et al.

(10) Patent No.: US 12,707,823 B2
(45) Date of Patent: Aug. 11, 2026

(54) DISPLAY APPARATUS INCLUDING A PIXEL-DEFINING LAYER WITH DIFFERENT TAPER ANGLES

(71) Applicant: Samsung Display Co., Ltd., Yongin-si (KR)

(72) Inventors: Jungsuk Bang, Yongin-si (KR); Min Kang, Yongin-si (KR); Jihoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 402 days.

(21) Appl. No.: 18/408,189

(22) Filed: Jan. 9, 2024

(65) Prior Publication Data

US 2024/0324299 A1 Sep. 26, 2024

(30) Foreign Application Priority Data

Mar. 24, 2023 (KR) ........................ 10-2023-0039100
Apr. 3, 2023 (KR) ........................ 10-2023-0043711

(51) Int. Cl.
*H10K 59/122* (2023.01)
*H10K 59/80* (2023.01)

(52) U.S. Cl.
CPC ..... *H10K 59/122* (2023.02); *H10K 59/80515* (2023.02)

(58) Field of Classification Search
CPC . H10K 59/124; H10K 59/122; H10K 59/8051
See application file for complete search history.

(56) References Cited

U.S. PATENT DOCUMENTS 9,306,189 B2 4/2016 Lee et al.
11,620,923 B2 4/2023 Heo et al.
2017/0018602 A1 1/2017 Yun et al.
2021/0264823 A1* 8/2021 Heo ........................ H10K 59/40
2022/0093707 A1* 3/2022 Lee ...................... H10K 71/135
2022/0165817 A1 5/2022 Kim et al.
2022/0231089 A1* 7/2022 Cho ...................... G06F 3/0412
2023/0087603 A1 3/2023 Wang et al.

FOREIGN PATENT DOCUMENTS

KR 10-2012046 B1 10/2019
KR 10-2021-0108535 A 9/2021
KR 10-2022-0072102 A 6/2022
KR 10-2022-0078528 A 6/2022
KR 10-2408938 B1 6/2022

* cited by examiner

*Primary Examiner* — William B Partridge
*Assistant Examiner* — Chevy J Boegel
(74) *Attorney, Agent, or Firm* — Womble Bond Dickinson (US) LLP

(57) ABSTRACT

A display apparatus includes a substrate, a first pixel electrode over the substrate, wherein a first distance between a first portion of the first pixel electrode and the substrate is different from a second distance between a second portion of the first pixel electrode and the substrate, and a pixel-defining layer covering a portion of the first pixel electrode and having a first opening exposing a central portion of the first pixel electrode, wherein a first taper angle of an inner surface of the first opening at a first defined portion covering the first portion is different from a second taper angle of an inner surface of the first opening at a second defined portion covering the second portion.

20 Claims, 7 Drawing Sheets

DISPLAY APPARATUS INCLUDING A PIXEL-DEFINING LAYER WITH DIFFERENT TAPER ANGLES

CROSS-REFERENCE TO RELATED APPLICATIONS

This application claims priority to and the benefit of Korean Patent Application Nos. 10-2023-0039100, filed on Mar. 24, 2023, and 10-2023-0043711, filed on Apr. 3, 2023, in the Korean Intellectual Property Office, the disclosures of which are incorporated by reference herein in their entireties.

BACKGROUND

1. Field

Aspects of embodiments of the present disclosure relate to a display apparatus, and more particularly, to a display apparatus that may display high-quality images.

2. Description of the Related Art

Generally, a display apparatus includes a pixel circuit including a display element such as an organic light-emitting element, and a thin-film transistor electrically connected thereto. Because the display element is disposed over the pixel circuit, the shape of the display element may be influenced by a structure in which the display element is connected to an element such as the thin-film transistor of the pixel circuit in the lower portion.

However, in a display apparatus according to the related art, a progression direction (e.g., emission direction) of light emitted from each pixel may be deflected in a specific direction.

The above information disclosed in this Background section is only for enhancement of understanding of the background of the invention and therefore it may contain information that does not form the prior art.

SUMMARY

Aspects of some embodiments of the present disclosure are directed to a display apparatus configured to display high-quality images. However, such a technical objective is merely an example, and the disclosure is not limited thereto.

Additional aspects will be set forth in part in the description which follows and, in part, will be apparent from the description, or may be learned by practice of the presented embodiments of the disclosure.

According to some embodiments of the present disclosure, there is provided a display apparatus including: a substrate; a first pixel electrode over the substrate, wherein a first distance between a first portion of the first pixel electrode and the substrate is different from a second distance between a second portion of the first pixel electrode and the substrate; and a pixel-defining layer covering a portion of the first pixel electrode and having a first opening exposing a central portion of the first pixel electrode, wherein a first taper angle of an inner surface of the first opening at a first defined portion of the pixel-defining layer covering the first portion is different from a second taper angle of an inner surface of the first opening at a second defined portion of the pixel-defining layer covering the second portion.

In some embodiments, the first distance is greater than the second distance, and the first taper angle is less than the second taper angle.

In some embodiments, the display apparatus further includes: a first conductive layer; and an insulating layer between the first conductive layer and the first pixel electrode, wherein the first pixel electrode is electrically connected to the first conductive layer through a first contact hole of the insulating layer, and the first contact hole is closer to the second portion than the first portion.

In some embodiments, the first and second portions are at opposite sides of the first pixel electrode with respect to a center of the first pixel electrode.

In some embodiments, when viewed in a direction perpendicular to the substrate, a portion of one of the first portion and the second portion adjoining the first opening has a round shape.

In some embodiments, wherein the first distance is greater than the second distance, and the first taper angle is less than the second taper angle, and wherein, when viewed in a direction perpendicular to the substrate, a portion of the first portion adjoining the first opening has a round shape.

In some embodiments, when viewed in a direction perpendicular to the substrate, a portion of the second portion adjoining the first opening has a straight line shape or an angled shape.

In some embodiments, the display apparatus further includes: a second pixel electrode on the substrate, wherein a third distance between a third portion of the second pixel electrode and the substrate is different from a fourth distance between a fourth portion of the second pixel electrode and the substrate, wherein the pixel-defining layer covers a portion of the second pixel electrode and has a second opening exposing a central portion of the second pixel electrode, and wherein a third taper angle of an inner surface of the second opening at a third defined portion of the pixel-defining layer covering the third portion is different from a fourth taper angle of an inner surface of the second opening at a fourth defined portion of the pixel-defining layer covering the fourth portion.

In some embodiments, the first and second portions are at opposite sides of the first pixel electrode with respect to a center of the first pixel electrode, and the third and fourth portions are at opposite sides of the second pixel electrode with respect to a center of the second pixel electrode.

In some embodiments, when viewed in a direction perpendicular to the substrate, a portion of one of the first portion and the second portion adjoining the first opening has a round shape, and a portion of one of the third portion and the fourth portion adjoining the second opening has a round shape.

In some embodiments, the first distance is greater than the second distance, the first taper angle is less than the second taper angle, the fourth distance is greater than the third distance, and the fourth taper angle is less than the third taper angle, and, when viewed in a direction perpendicular to the substrate, a portion of the first portion adjoining the first opening has a round shape, and a portion of the fourth portion adjoining the second opening has a round shape.

In some embodiments, when viewed in a direction perpendicular to the substrate, a portion of the second portion adjoining the first opening has a straight line shape or an angled shape, and a portion of the third portion adjoining the second opening has a straight line shape or an angled shape.

In some embodiments, the first distance is greater than the second distance, the first taper angle is less than the second taper angle, the fourth distance is greater than the third distance, and the fourth taper angle is less than the third taper angle.

In some embodiments, the display apparatus further includes: a first conductive layer and a second conductive layer positioned on a same layer; and an insulating layer covering the first conductive layer and the second conductive layer, wherein the first pixel electrode and the second pixel electrode are on the insulating layer, the first pixel electrode is electrically connected to the first conductive layer through a first contact hole of the insulating layer, the second pixel electrode is electrically connected to the second conductive layer through a second contact hole of the insulating layer, and wherein the first contact hole is closer to the second portion than the first portion, and the second contact hole is closer to the third portion than the fourth portion.

In some embodiments, the first contact hole is closer to the third portion than the fourth portion, and the second contact hole is closer to the second portion than the first portion.

In some embodiments, the second portion is a portion of the first pixel electrode in a direction toward the second pixel electrode, and the third portion is a portion of the second pixel electrode in a direction toward the first pixel electrode.

In some embodiments, the display apparatus further includes: a third pixel electrode over the substrate, a fifth distance between a fifth portion of the third pixel electrode and the substrate is less than a sixth distance between a sixth portion of the third pixel electrode and the substrate; a first conductive layer, a second conductive layer, and a third conductive layer, on a same layer and sequentially arranged in a first direction; and an insulating layer covering the first conductive layer, the second conductive layer, and the third conductive layer, wherein the first pixel electrode, the second pixel electrode, and the third pixel electrode are on the insulating layer, wherein the first pixel electrode is electrically connected to the first conductive layer through a first contact hole of the insulating layer, the second pixel electrode is electrically connected to the second conductive layer through a second contact hole of the insulating layer, and the third pixel electrode is electrically connected to the third conductive layer through a third contact hole of the insulating layer, and wherein the first contact hole is closer to the second portion than the first portion, the second contact hole is closer to the third portion than the fourth portion, and the third contact hole is closer to the fifth portion among the fifth portion and the sixth portion.

In some embodiments, a first virtual line connecting a center of the first pixel electrode to a center of the third pixel electrode extends in the first direction, and a center of the second pixel electrode is located in a second direction perpendicular to the first direction with respect to the first virtual line, and wherein the first contact hole, the second contact hole, and the third contact hole are located between the first virtual line and a second virtual line passing through the center of the second pixel electrode and parallel to the first virtual line.

According to some embodiments of the present disclosure, there is provided a display apparatus including: first pixel electrodes and third pixel electrodes alternately arranged in a first row extending in a first direction; second pixel electrodes arranged in a second row extending in the first direction; first conductive layers, second conductive layers, and third conductive layers arranged between the first row and the second row, the first conductive layers corresponding to the first pixel electrodes, the second conductive layers corresponding to the second pixel electrodes, and the third conductive layers corresponding to the third pixel electrodes; an insulating layer covering the first conductive layers, the second conductive layers, and the third conductive layers; and a pixel-defining layer covering the first pixel electrodes, the second pixel electrodes, and the third pixel electrodes, and including first openings exposing central portions of the first pixel electrodes, second openings exposing central portions of the second pixel electrodes, and third openings exposing central portions of the third pixel electrodes, wherein the first pixel electrodes, the second pixel electrodes, and the third pixel electrodes are on the insulating layer, wherein the first pixel electrodes are electrically connected to the first conductive layers through first contact holes of the insulating layer, the second pixel electrodes are electrically connected to the second conductive layers through second contact holes of the insulating layer, and the third pixel electrodes are electrically connected to the third conductive layers through third contact holes of the insulating layer, and wherein, in a second direction perpendicular to the first direction, a second taper angle at a portion of an inner surface of each of the first openings in a direction toward the second row is different from a first taper angle at a portion in a direction away from of the second row, a fifth taper angle at a portion of an inner surface of each of the third openings in a direction toward the second row is different from a sixth taper angle at a portion in a direction away from the second row, and a third taper angle at a portion of an inner surface of each of the second openings in a direction toward the first row is different from a fourth taper angle at a portion in a direction away from the first row.

In some embodiments, the first taper angle is less than the second taper angle, the sixth taper angle is less than the fifth taper angle, and the fourth taper angle is less than the third taper angle.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
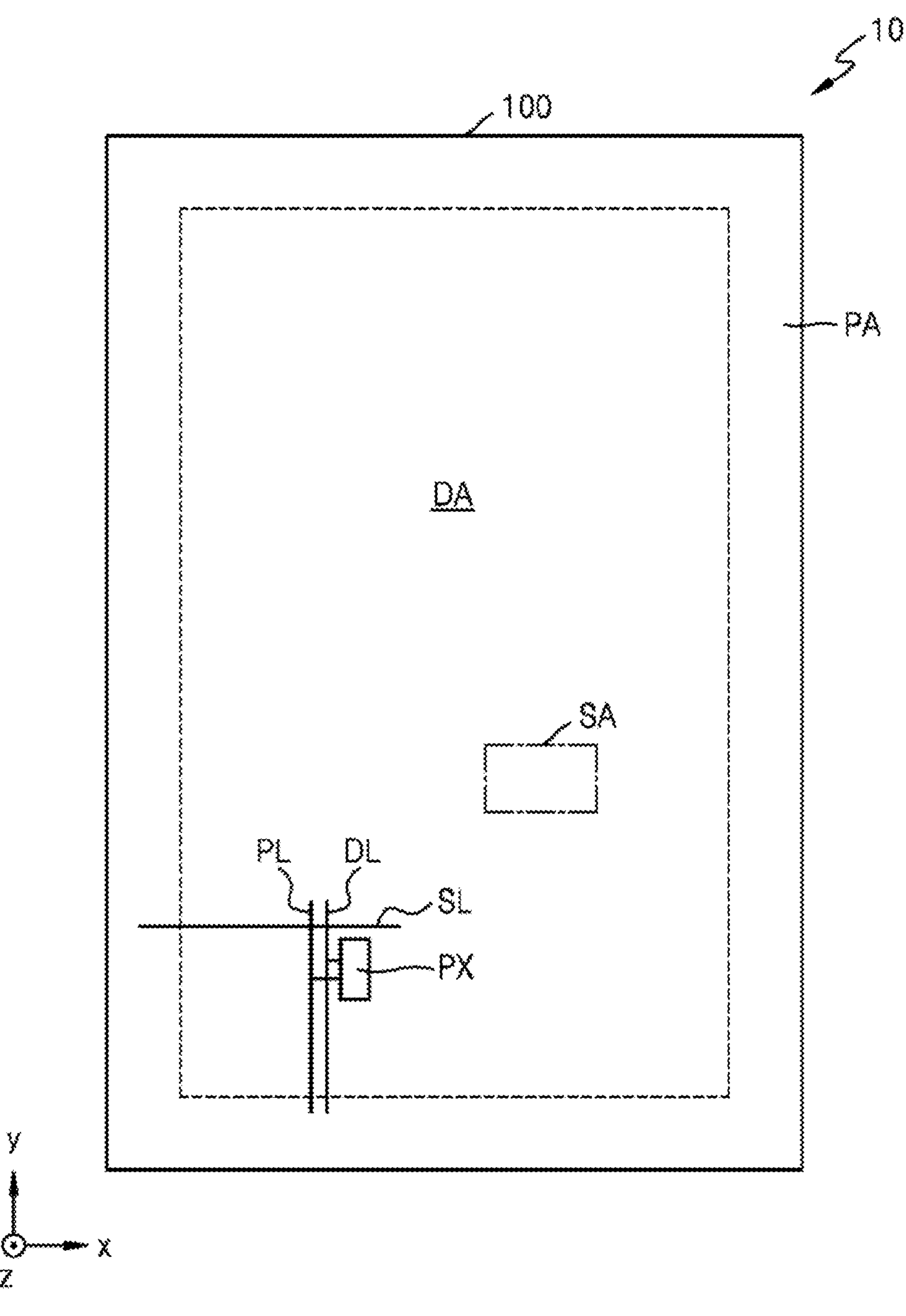
FIG. 1 is a schematic plan view of a display apparatus according to some embodiments of the present disclosure.

Reference will now be made in detail to some embodiments of the present disclosure, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the disclosure allows for various suitable changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various suitable forms.

Hereinafter, embodiments will be described with reference to the accompanying drawings, wherein like reference numerals refer to like elements throughout and a repeated description thereof is omitted.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different orientations that are not perpendicular to one another.

FIG. 1 is a schematic plan view of a display apparatus according to some embodiments of the present disclosure. As shown in FIG. 1, the display apparatus according to some embodiments includes a display panel 10. As long as a display apparatus includes the display panel 10, any display apparatus may be used. As an example, the display apparatus may include various apparatuses such as smartphones, tablet computers, laptop computers, televisions, advertisement boards, or the like.

The display panel 10 may include a display area DA and a peripheral area PA arranged outside the display area DA. It is shown in FIG. 1 that the display area DA has a rectangular shape. However, embodiments of the present disclosure are not limited thereto. The display area DA may have various suitable shapes, for example, circular shapes, elliptical shapes, other polygonal shapes, or shapes of specific figures.

The display area DA is a region in which images are displayed, and a plurality of pixels PX may be arranged in the display area DA. Each pixel PX may include a light-emitting element such as an organic light-emitting diode. Each pixel PX may be configured to emit, for example, red, green, or blue light. The pixel PX may be connected to a pixel circuit including a thin-film transistor TFT, a storage capacitor, and the like. The pixel circuit may be connected to a scan line SL, a data line DL, and a driving voltage line PL. The scan line SL is configured to transfer scan signals, the data line DL crosses the scan line SL and is configured to transfer data signals, and the driving voltage line PL is configured to supply a driving voltage. The scan line SL may extend in a first direction (an x axis direction), the data line DL and the driving voltage line PL may extend in a second direction (a y axis direction) crossing the first direction.

The pixel PX may be configured to emit light of a brightness corresponding to an electrical signal from the pixel circuit electrically connected thereto. The display area DA may be configured to display preset images by using light emitted from the pixel PX. For reference, the pixel PX may be defined as an emission region that is configured to emit light having one of red, green, and blue.

The peripheral area PA is a region in which pixels PX are not arranged and may be a region that is configured not to display images. A power supply line for driving the pixel PX and the like may be arranged in the peripheral area PA. In addition, a printed circuit board including a driving circuit portion or a terminal portion to which a driver integrated circuit (IC) is connected may be arranged in the peripheral area PA.

For reference, because the display panel 10 includes a substrate 100, it may be understood that the substrate 100 includes the display area DA and the peripheral area PA.

Figure 2:
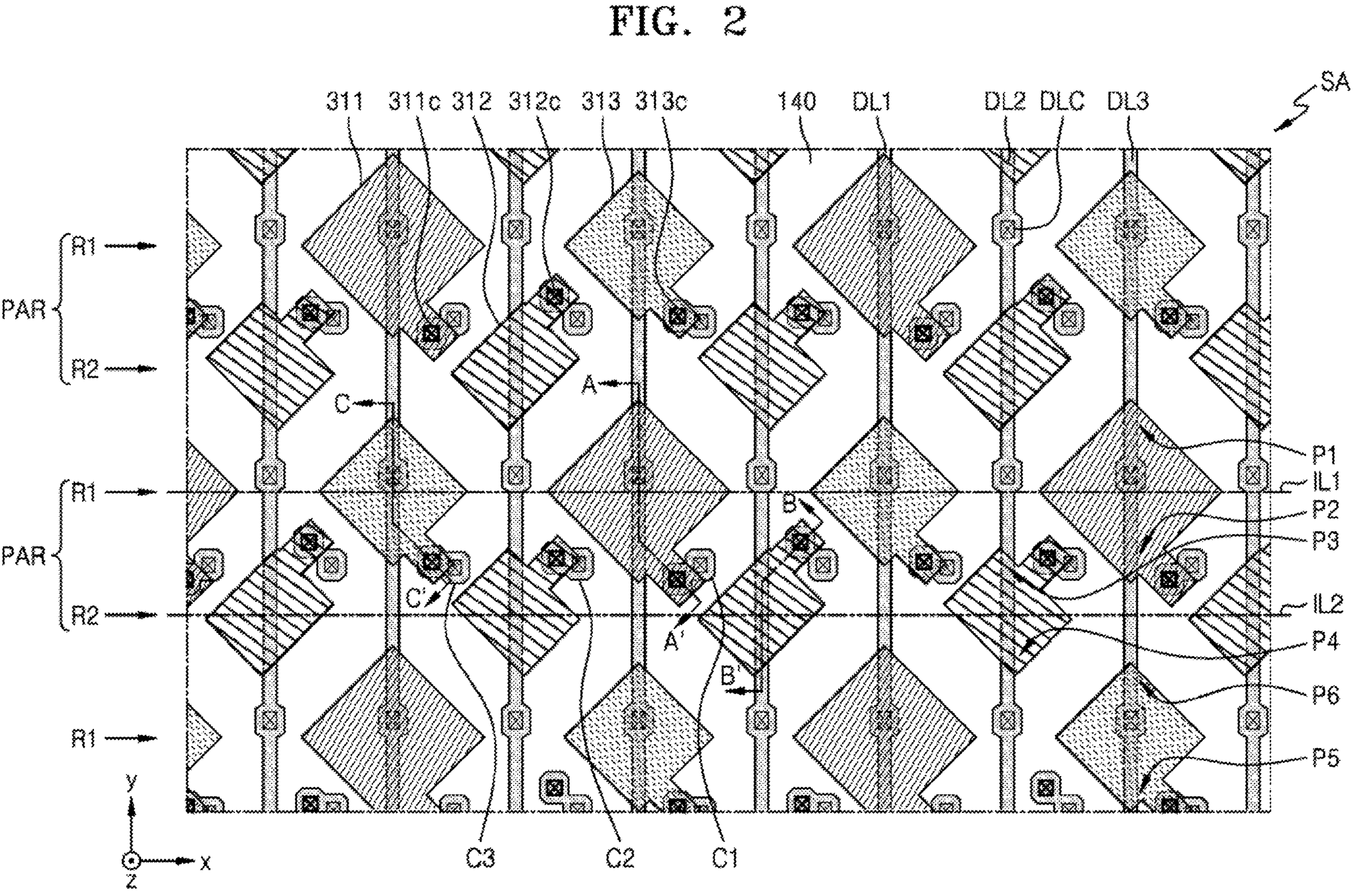
FIG. 2 is a schematic plan view of a portion of the display apparatus of FIG. 1, according to some embodiments of the present disclosure.
Figure 3:
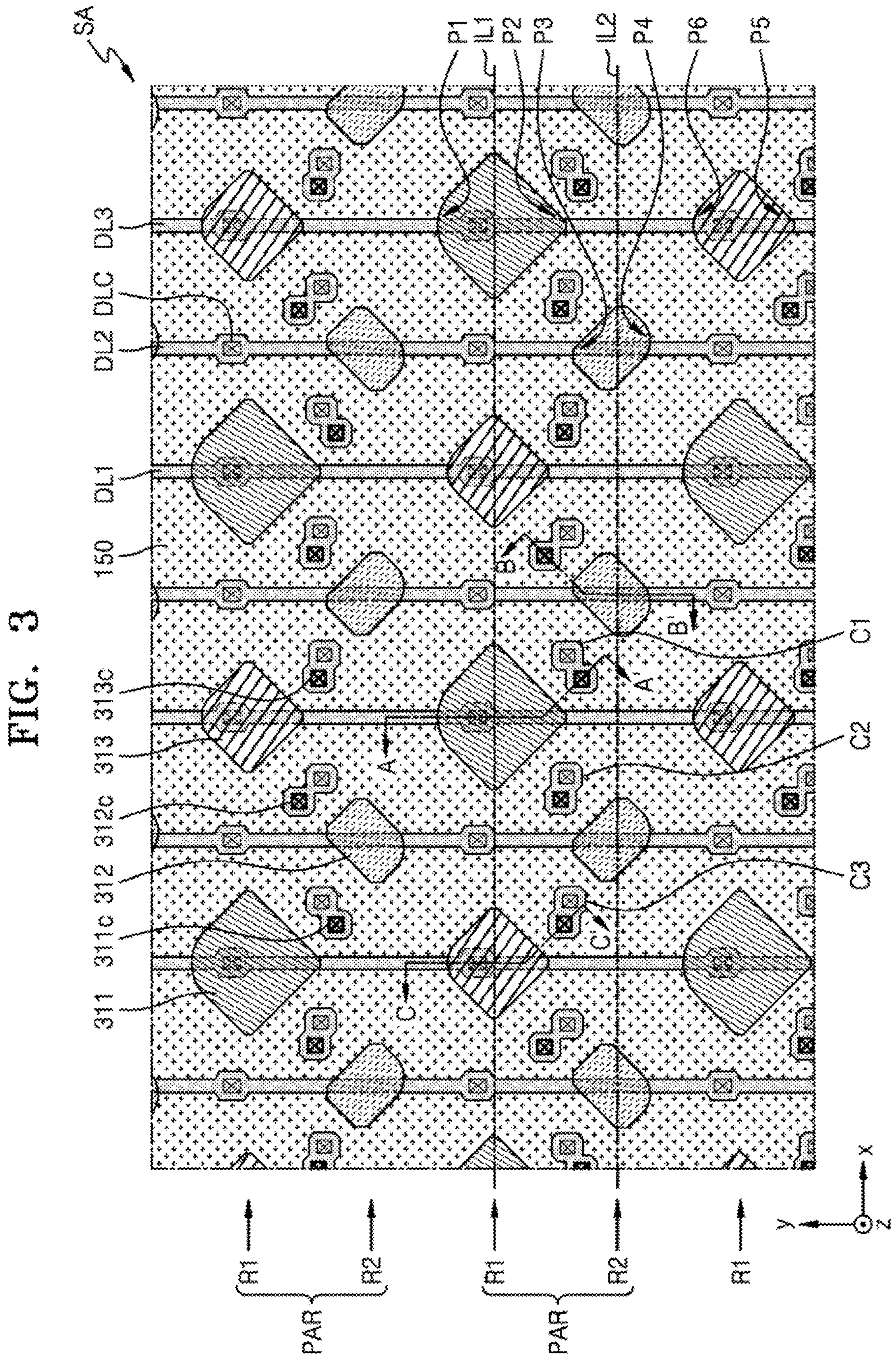
FIG. 3 is a schematic plan view of a portion of the display apparatus of FIG. 1, according to some embodiments of the present disclosure.

FIG. 2 is a schematic plan view of a portion of the display apparatus of FIG. 1, according to some embodiments of the present disclosure. FIG. 2 may be an enlarged plan view of a region SA, which may be a sample region of FIG. 1. It is shown in FIG. 2 that, among elements of a display apparatus, a first pixel electrode 311, a second pixel electrode 312, and a third pixel electrode 313 are disposed on a planarization layer 140, which is an insulating layer over the substrate 100, and in addition, some other elements of the display apparatus are shown. FIG. 3 is a schematic plan view of a portion of the display apparatus of FIG. 1, according to some embodiments of the present disclosure, and shows a pixel-defining layer 150 covering the edges of each of the first pixel electrode 311, the second pixel electrode 312, and the third pixel electrode 313 of FIG. 2.

As shown in FIGS. 2 and 3, the display apparatus may include the first pixel electrode 311, the second pixel electrode 312, and the third pixel electrode 313. The first pixel electrode 311, the second pixel electrode 312, and the third pixel electrode 313 may be elements of pixels configured to emit light of different colors. As an example, the first pixel electrode 311 may be a pixel electrode of a pixel configured to emit blue light, the second pixel electrode 312 may be a pixel electrode of a pixel configured to emit green light, and the third pixel electrode 313 may be a pixel electrode of a pixel configured to emit red light.

The sizes, that is, areas of the first pixel electrode 311, the second pixel electrode 312, and the third pixel electrode 313 may be different from each other. As an example, the area of the second pixel electrode 312 may be less than the area of the first pixel electrode 311 and the area of the third pixel electrode 313. However, the embodiment is not limited thereto. As an example, the areas of the first pixel electrode 311, the second pixel electrode 312, and the third pixel electrode 313 may be substantially the same.

The pixel-defining layer 150 covers the edges of each of the first pixel electrode 311, the second pixel electrode 312, and the third pixel electrode 313. That is, the pixel-defining layer 150 may have a first opening exposing the central portion of the first pixel electrode 311, a second opening exposing the central portion of the second pixel electrode 312, and a third opening exposing the central portion of the third pixel electrode 313. Portions of the first pixel electrode 311, the second pixel electrode 312, and the third pixel electrode 313 that are not covered by the pixel-defining layer 150 may be respectively an emission area of a first pixel, an emission area of a second pixel, and an emission area of a third pixel. That is, the emission area of each pixel may be defined by the opening of the pixel-defining layer 150.

As described above, the sizes, that is, areas of the first pixel electrode 311, the second pixel electrode 312, and the third pixel electrode 313 may be different from each other. As an example, the area of the second pixel electrode 312 may be less than the area of the first pixel electrode 311 and the area of the third pixel electrode 313. Likewise, the sizes, that is, areas of an emission area of the first pixel, an emission area of the second pixel, and an emission area of the third pixel may be different from each other. As an example, the area of the emission area of the second pixel may be less than the area of the emission area of the first pixel and the area of the emission area of the third pixel.

The first pixel electrode 311, the second pixel electrode 312, and the third pixel electrode 313 may be arranged in a pentile configuration. That is, assuming a virtual quadrangle centered at the center of the second pixel electrode 312, the first pixel electrodes 311 may be arranged at two diagonal vertices of the virtual quadrangle, and the third pixel electrodes 313 may be arranged at the other two diagonal vertices. The virtual quadrangle may be a square shape.

Because the first pixel electrode 311, the second pixel electrode 312, and the third pixel electrode 313 are arranged in this manner, the first pixel electrode 311 and the third pixel electrode 313 may be alternately arranged in the first direction (the x axis direction) and the second direction (the y axis direction). The second pixel electrodes 312 may be arranged in the first direction (the x axis direction) and the second direction (the y axis direction). Accordingly, one first pixel electrode 311 may be surrounded by four second pixel electrodes 312 and four third pixel electrodes 313.

This configuration of the first pixel electrode 311, the second pixel electrode 312, and the third pixel electrode 313 may be described in the following manner. The first pixel electrodes 311 and the third pixel electrodes 313 may be alternately arranged in a first row R1 extending in the first direction (the x axis direction). It is shown in FIGS. 2 and 3 that the first pixel electrodes 311 and the third pixel electrodes 313 are alternately arranged on a first virtual line IL1. The first virtual line IL1 connecting the center of the first pixel electrode 311 to the center of the third pixel electrode 313 may extend in the first direction (the x axis direction). The center of the second pixel electrode 312 may be located in the second direction (the y axis direction) with respect to the first virtual line IL1. In addition, the second pixel electrodes 312 may be arranged in a second row R2 also extending in the first direction (the x axis direction). It is shown in FIGS. 2 and 3 that the second pixel electrodes 312 are arranged on a second virtual line IL2 parallel to the first virtual line IL1. A pair PAR of the first row R1 and the second row R2 may be repeatedly arranged in the second direction (the y axis direction). In such examples, the first pixel electrodes 311 and the third pixel electrodes 313 may be alternately arranged in the second direction (the y axis direction).

However, the embodiment is not limited to the configuration in which the first pixel electrode 311, the second pixel electrode 312, and the third pixel electrode 313 are arranged in a pentile manner. As an example, the first pixel electrode 311, the second pixel electrode 312, and the third pixel electrode 313 may be arranged in a stripe configuration. That is, the first pixel electrode 311, the second pixel electrode 312, and the third pixel electrode 313 may be sequentially arranged in the x axis direction. Unlike this, the pixels may be arranged in a mosaic configuration. In addition, in the display apparatus according to some embodiments, the first pixel electrode 311, the second pixel electrode 312, and the third pixel electrode 313 may be arranged in an S-stripe configuration. In such examples, the second pixel electrode 312 and the third pixel electrode 313 may be alternately arranged in the second direction (the y axis direction), and the first pixel electrode 311 and a pair of the second pixel electrode 312 and the third pixel electrode 313 may be alternately arranged in the first direction (the x axis direction).

A second data line DL2 extending in the second direction (the y axis direction) may be disposed below the second pixel electrodes 312. In the first direction (the x axis direction), a first data line DL1 extending in the second direction (the y axis direction) may be arranged on one side (in a −x direction) of the second data line DL2, and a third data line DL3 extending in the second direction (the y axis direction) may be arranged on another side (in a +x direction). In a plan view, the second data line DL2 may pass through the approximate center of each of the second pixel electrodes 312. Similarly, the first data line DL1 may pass through the approximate center of each of the first pixel electrodes 311 and the approximate center of each of the third pixel electrodes 313. Likewise, the third data line DL3 may pass through the approximate center of each of the first pixel electrodes 311 and the approximate center of each of the third pixel electrodes 313.

When a data line disposed below a specific pixel electrode is disposed to be shifted to one side without passing through the approximate center of the pixel electrode, the pixel electrode may be inclined by being influenced by the data line. In such examples, when external light incident to the display apparatus from the outside is reflected by the relevant pixel electrode, the light may be reflected in a specific direction and a user may recognize a reflective color band in the specific direction. However, in the display apparatus according to some embodiments, because the data lines extending in the second direction (the y axis direction) pass through the approximate center of the pixel electrodes in a plan view, it is possible to prevent or reduce a user's recognition of a reflective color band caused by external light reflection.

The first data line DL1, the second data line DL2, and the third data line DL3 may be disposed on (or in) the same layer. Each of the first data line DL1, the second data line DL2, and the third data line DL3 may be electrically connected to a corresponding thin film transistor or the like disposed below through a data line contact hole DLC. As an example, each of the first data line DL1, the second data line DL2, and the third data line DL3 may be electrically connected to one of a source region and a drain region of a semiconductor layer included in a corresponding switching transistor through the data line contact hole DLC.

The first pixel electrode 311 may be electrically connected to a first conductive layer C1 disposed therebelow through a first contact hole 311*c*. Likewise, the second pixel electrode 312 may be electrically connected to a second conductive layer C2 disposed therebelow through a second contact hole 312*c*. In addition, the third pixel electrode 313 may be electrically connected to a third conductive layer C3 disposed therebelow through a third contact hole 313*c*.

The first conductive layer C1, the second conductive layer C2, and the third conductive layer C3 may be disposed, for example, on the same layer as a layer on which the first data line DL1, the second data line DL2, and the third data line DL3 are disposed. That is, the first conductive layer C1, the second conductive layer C2, the third conductive layer C3, the first data line DL1, the second data line DL2, and the third data line DL3 may be disposed on (or in) the same layer. The first conductive layer C1, the second conductive layer C2, and the third conductive layer C3 may be electrically connected to the corresponding thin-film transistor and the like disposed therebelow through a contact hole. As an example, each of the first conductive layer C1, the second conductive layer C2, and the third conductive layer C3 may be electrically connected to one of a source region and a drain region of a semiconductor layer included in a corresponding driving transistor or emission control transistor disposed therebelow.

Figure 4:
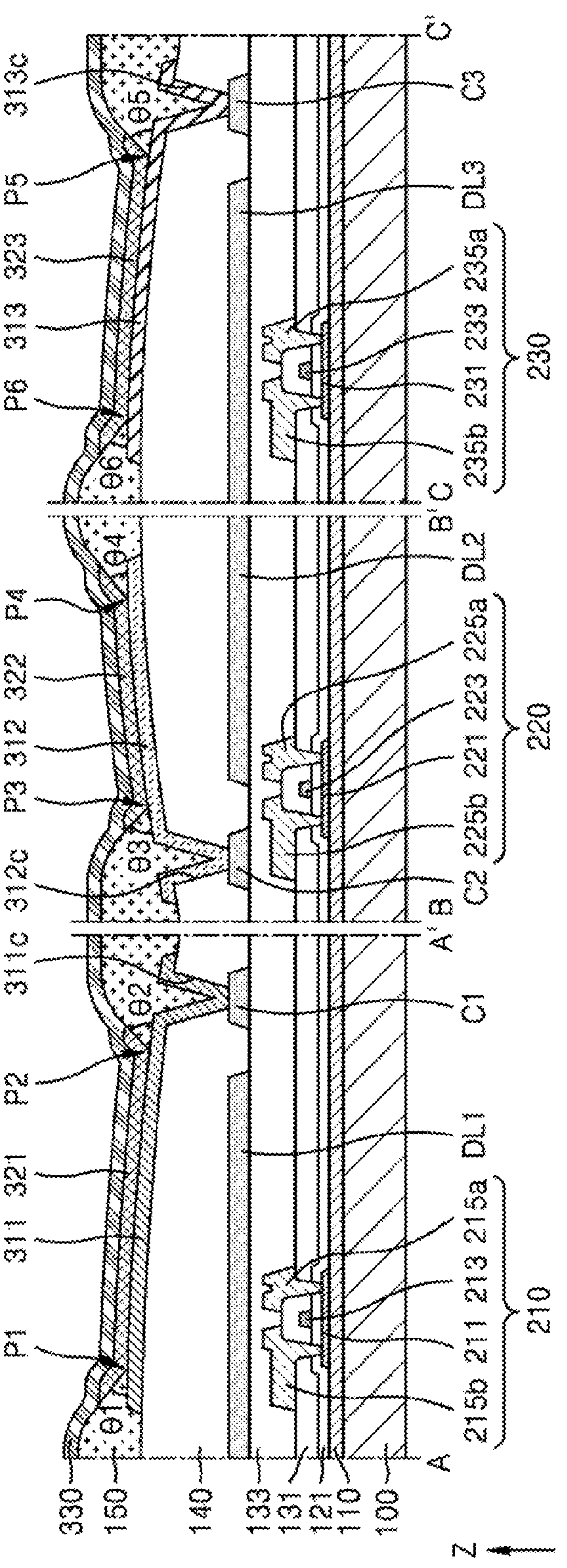
FIG. 4 shows schematic cross-sectional views of the display apparatus of FIGS. 2 and 3, taken along the lines A-A', B-B', and C-C' of FIGS. 2 and 3, according to some embodiments of the present disclosure.

FIG. 4 is a schematic cross-sectional view of the display apparatus of FIGS. 2 and 3, taken along the lines A-A', B-B', and C-C' of FIGS. 2 and 3, according to some embodiments of the present disclosure.

The display apparatus according to some embodiments may include the substrate 100, the planarization layer 140 disposed over the substrate 100, the first pixel electrode 311, the second pixel electrode 312, and the third pixel electrode 313 disposed on the planarization layer 140, the pixel-defining layer 150, a first intermediate layer 321, a second intermediate layer 322, and a third intermediate layer 323, and an opposite electrode 330.

The substrate 100 may include glass, metal, polymer resin, and/or the like. In the case where the substrate 100 is flexible or bendable, the substrate 100 may include, for example, a polymer resin including polyethersulphone, polyacrylate, polyetherimide, polyethylene naphthalate, polyethylene terephthalate, polyphenylene sulfide, polyarylate, polyimide, polycarbonate, cellulose acetate propionate, and/or the like. The substrate 100 may have a multi-layered structure including two layers each including the polymer resin, and a barrier layer including an inorganic material (such as silicon oxide, silicon nitride, silicon oxynitride, and/or the like) therebetween. However, various modifications may be made.

As described above, the first pixel electrode 311, the second pixel electrode 312, and the third pixel electrode 313 are disposed over the substrate 100. Besides the first pixel electrode 311, the second pixel electrode 312, and the third pixel electrode 313, a first thin-film transistor 210, a second thin-film transistor 220, and a third thin-film transistor 230 respectively connected to the first pixel electrode 311, the second pixel electrode 312, and the third pixel electrode 313 may be disposed over the substrate 100. That is, as shown in FIG. 4, the first thin-film transistor 210 may be disposed below the first pixel electrode 311, the second thin-film transistor 220 may be disposed below the second pixel electrode 312, and the third thin-film transistor 230 may be disposed below the third pixel electrode 313. The pixel electrode may be electrically connected to the corresponding thin-film transistor directly or through another conductive layer and the like. The first pixel electrode 311, the second pixel electrode 312, and the third pixel electrode 313 may be disposed on the planarization layer 140 described below that is disposed over the substrate 100.

The first thin-film transistor 210 may include a first semiconductor layer 211, a first gate electrode 213, a first source electrode 215*a*, and a first drain electrode 215*b*, wherein the first semiconductor layer 211 includes amorphous silicon, polycrystalline silicon, an organic semiconductor material, or an oxide semiconductor material. The first gate electrode 213 may include various conductive materials and have various layered structures, and include, for example, a molybdenum (Mo) layer an aluminum (Al) layer, and/or the like. In such examples, the first gate electrode 213 may have a layered structure of Mo/Al/Mo. In some other examples, the first gate electrode 213 may include a titanium nitride ($TiN_x$) layer, an Al layer, a Ti layer, and/or the like. The first source electrode 215*a* and the first drain electrode 215*b* may also include various conductive materials and various layered structures, and may include, for example, a Ti layer, an Al layer, a copper (Cu) layer, and/or the like. In such examples, the first source electrode 215*a* and the first drain electrode 215*b* may each have a layered structure of Ti/Al/Ti.

Although it is shown in FIG. 4 that the first thin-film transistor 210 includes both the first source electrode 215*a* and the first drain electrode 215*b*, the embodiment is not limited thereto. As an example, a source region of the first semiconductor layer 211 of the first thin-film transistor 210 may be integrated with a drain region of a semiconductor layer of another thin-film transistor. In such examples, the first thin-film transistor 210 may not include the first source electrode 215*a*. The first source electrode 215*a* and/or the first drain electrode 215*b* may be a portion of a wiring.

To secure insulation between the first semiconductor layer 211 and the first gate electrode 213, a gate insulating layer 121 may be disposed between the first semiconductor layer 211 and the first gate electrode 213. The gate insulating layer 121 includes an inorganic material such as silicon oxide, silicon nitride, silicon oxynitride, and/or the like. In addition, an interlayer insulating layer 131 may be disposed on the first gate electrode 213, wherein the interlayer insulating layer 131 includes an inorganic material such as silicon oxide, silicon nitride, silicon oxynitride, and/or the like. The first source electrode 215*a* and the first drain electrode 215*b* may be disposed on the interlayer insulating layer 131. The insulating layer including the inorganic material may be formed by chemical vapor deposition (CVD) or atomic layer deposition (ALD). This is also applicable to embodiments below and modifications thereof. When desired, various conductive layers and insulating layers may be further added.

A buffer layer 110 may be disposed between the first thin-film transistor 210 having the above structure and the substrate 100, wherein the buffer layer 110 includes an inorganic material such as silicon oxide, silicon nitride, silicon oxynitride, and/or the like. The buffer layer 110 may increase flatness of the upper surface of the substrate 100, or prevent or reduce the penetration of impurities from the substrate 100 or the like into the first semiconductor layer 211 of the first thin-film transistor 210.

The second thin-film transistor 220 disposed below the second pixel electrode 312 may include a second semiconductor layer 221, a second gate electrode 223, a second source electrode 225*a*, and a second drain electrode 225*b*. The third thin-film transistor 230 located below the third pixel electrode 313 may include a third semiconductor layer 231, a third gate electrode 233, a third source electrode 235*a*, and a third drain electrode 235*b*. Because the structure of the second thin-film transistor 220 and the structure of the third thin-film transistor 230 are the same as or similar to the structure of the first thin-film transistor 210, descriptions thereof may be omitted.

A protective layer 133 may be disposed on the first thin-film transistor 210, the second thin-film transistor 220, and the third thin-film transistor 230. The protective layer 133 may include an inorganic material such as silicon oxide, silicon nitride, silicon oxynitride, and/or the like. In such examples, unlike in FIG. 4, the upper surface of the protective layer 133 may have irregularities corresponding to the shapes of the elements disposed therebelow. In some examples, when desired, the protective layer 133 may include an organic material, for example, acryl, benzocyclobutene (BCB), hexamethyldisiloxane (HMDSO), and/or the like. In such examples, the protective layer 133 may have an approximately flat upper surface.

The first data line DL1, the second data line DL2, the third data line DL3, the first conductive layer C1, the second conductive layer C2, and the third conductive layer C3 may be disposed on the protective layer 133. In FIG. 4, the data line contact hole DLC that electrically connects the data line to the element therebelow is omitted, for convenience of illustration.

The planarization layer 140, which is an insulating layer, may be disposed on the first data line DL1, the second data line DL2, the third data line DL3, the first conductive layer C1, the second conductive layer C2, and the third conductive layer C3. The first pixel electrode 311, the second pixel electrode 312, and the third pixel electrode 313 may be disposed on the planarization layer 140. Because the planarization layer 140 covering the first data line DL1, the first conductive layer C1 and the like has an approximately flat upper surface with reduced irregularities, the first pixel electrode 311 of the light-emitting element and the like may be disposed on the flat surface. The planarization layer 140 may include, for example, acryl, benzocyclobutene (BCB), hexamethyldisiloxane (HMDSO), and/or the like. Although it is shown in FIG. 4 that the planarization layer 140 is a single layer, the planarization layer 140 may be a multi-layer. However, various suitable modifications may be made.

The first intermediate layer 321 including an emission layer may be disposed on the first pixel electrode 311, the second intermediate layer 322 including an emission layer may be disposed on the second pixel electrode 312, and the third intermediate layer 323 including an emission layer may be disposed on the third pixel electrode 313. The emission layer of the first intermediate layer 321 may be configured to emit, for example, blue light; the emission layer of the second intermediate layer 322 may be configured to emit, for example, green light; and the emission layer of the third intermediate layer 323 may be configured to emit, for example, red light.

As shown in FIG. 4, the first pixel electrode 311 may be electrically connected to the first thin-film transistor 210 by being in contact with one of the first source electrode 215*a* and the first drain electrode 215*b* through the first contact hole 311*c* formed in the planarization layer 140 and the like. The first pixel electrode 311 may include a light-transmissive conductive layer and a reflective layer. The light-transmissive conductive layer includes a light-transmissive conductive oxide such as indium tin oxide (ITO), indium oxide ($In_2O_3$), indium zinc oxide (IZO), and/or the like, and the reflective layer includes metal such as aluminum (Al), silver (Ag), and/or the like. As an example, the first pixel electrode 311 may have a three-layered structure of ITO/Ag/ITO. The second pixel electrode 312 may be electrically connected to the second thin-film transistor 220 by being in contact with one of the second source electrode 225*a* and the second drain electrode 225*b* through the second contact hole 312*c* formed in the planarization layer 140 and the like. The third pixel electrode 313 may be electrically connected to the third thin-film transistor 230 by being in contact with one of the third source electrode 235*a* and the third drain electrode 235*b* through the third contact hole 313*c* formed in the planarization layer 140 and the like. The description of the first pixel electrode 311 is applicable to the second pixel electrode 312 and the third pixel electrode 313.

Each of the first intermediate layer 321, the second intermediate layer 322, and the third intermediate layer 323 may include a hole injection layer, a hole transport layer, and/or an electron transport layer when desired in addition to the emission layer. The layers other than the emission layer may have a shape integrated over the first pixel electrode 311, the second pixel electrode 312, and the third pixel electrode 313. Some of the layers may be patterned to correspond to the first pixel electrode 311, the second pixel electrode 312, and the third pixel electrode 313 when desired.

The opposite electrode 330 on the first intermediate layer 321, the second intermediate layer 322, and the third intermediate layer 323 may have a shape integrated over the first pixel electrode 311, the second pixel electrode 312, and the third pixel electrode 313. The opposite electrode 330 may include a light-transmissive conductive layer including ITO, $In_2O_3$, IZO, and/or the like, and include a semi-transmissive layer including metal such as aluminum (Al), lithium (Li), magnesium (Mg), ytterbium (Yb), silver (Ag), and/or the like. As an example, the opposite electrode 330 may be a semi-transmissive layer including MgAg, AgYb, Yb/MgAg, Li/MgAg, and/or the like.

The pixel-defining layer 150 may be disposed on the planarization layer 140. The pixel-defining layer 150 may include openings respectively corresponding to the pixels. That is, the pixel-defining layer 150 covers the edges of each of the first pixel electrode 311, the second pixel electrode 312, and the third pixel electrode 313, and includes a first opening that exposes the central portion of the first pixel electrode 311, a second opening that exposes the central portion of the second pixel electrode 312, and a third opening that exposes the central portion of the third pixel electrode 313. The pixel-defining layer 150 may define the pixels. As shown in FIG. 4, the pixel-defining layer 150 may prevent arcs and the like from occurring (or substantially reduced instances thereof) at the edges of the first pixel electrode 311, the second pixel electrode 312, and the third pixel electrode 313 by increasing a distance between the opposite electrode 330 and the edges of each of the first pixel electrode 311, the second pixel electrode 312, and the third pixel electrode 313. The pixel-defining layer 150 may include an organic material such as polyimide, HMDSO, and/or the like.

The organic light-emitting elements including the first pixel electrode 311, the second pixel electrode 312, the third pixel electrode 313, the first intermediate layer 321, the second intermediate layer 322, the third intermediate layer 323, and the opposite electrode 330 may be deteriorated by moisture, oxygen or the like. Accordingly, to protect the organic light-emitting elements from external moisture, oxygen or the like, the display apparatus may include an encapsulation layer covering the organic light-emitting elements.

As shown in FIGS. 2 to 4, the first pixel electrode 311 may include a first portion P1 and a second portion P2. When considering the first pixel electrode 311 and the second pixel electrode 312 belonging to the same pair PAR, the second portion P2 of the first pixel electrode 311 in the second direction (the y axis direction) may be a portion of the first pixel electrode 311 in the direction to the second pixel electrode 312. In addition, the second portion P2 and the first portion P1 may be at opposite sides with respect to the center of the first pixel electrode 311. In such examples, as shown in FIG. 4, a first distance between the first portion P1 and the substrate 100 may be different from a second distance between the second portion P2 and the substrate 100. For example, the first distance between the first portion P1 and the substrate 100 may be greater than the second distance between the second portion P2 and the substrate 100.

Similarly, the second pixel electrode 312 may include a third portion P3 and a fourth portion P4. When considering the first pixel electrode 311 and the second pixel electrode 312 belonging to the same pair PAR, the third portion P3 of the second pixel electrode 312 in the second direction (the y axis direction) may be a portion of the second pixel electrode 312 in the direction to the first pixel electrode 311. In addition, the fourth portion P4 and the third portion P3 may be at opposite sides with respect to the center of the second pixel electrode 312. In such examples, as shown in FIG. 4, a fourth distance between the fourth portion P4 and the substrate 100 may be different from a third distance between the third portion P3 and the substrate 100. For example, the fourth distance between the fourth portion P4 and the substrate 100 may be greater than the third distance between the third portion P3 and the substrate 100.

The third pixel electrode 313 may include a fifth portion P5 and a sixth portion P6. When considering the third pixel electrode 313 and the second pixel electrode 312 belonging to the same pair PAR, the fifth portion P5 of the third pixel electrode 313 in the second direction (the y axis direction) may be a portion of the third pixel electrode 313 in the direction to the second pixel electrode 312. In addition, the sixth portion P6 and the fifth portion P5 may be at opposite sides with respect to the center of the third pixel electrode 313. In such examples, as shown in FIG. 4, a sixth distance between the sixth portion P6 and the substrate 100 may be different from a fifth distance between the fifth portion P5 and the substrate 100. For example, the sixth distance between the sixth portion P6 and the substrate 100 may be greater than the fifth distance between the fifth portion P5 and the substrate 100.

During the process of manufacturing the display apparatus, the planarization layer 140 covering the first conductive layer C1, the second conductive layer C2, and the third conductive layer C3 is formed. The upper surface of the planarization layer 140 may be approximately parallel to the upper surface of the substrate 100. As shown in FIGS. 2 to 4, the first contact hole 311*c*, the second contact hole 312*c*, and the third contact hole 313*c* are formed in the planarization layer 140. In such examples, when the first contact hole 311*c*, the second contact hole 312*c*, and the third contact hole 313*c* gather at a specific position, a portion of the planarization layer 140 near the specific position may be removed together during the process of forming the first contact hole 311*c*, the second contact hole 312*c*, and the third contact hole 313*c*.

As shown in FIGS. 2 and 3, the first pixel electrodes 311 and the third pixel electrodes 313 are alternately arranged in the first row R1 extending in the first direction (the x axis direction). It is shown in FIGS. 2 and 3 that the first pixel electrodes 311 and the third pixel electrodes 313 are alternately arranged on the first virtual line IL1. In addition, the second pixel electrodes 312 may be arranged in the second row R2 also extending in the first direction (the x axis direction). It is shown in FIGS. 2 and 3 that the second pixel electrodes 312 are arranged on a second virtual line IL2 parallel to the first virtual line IL1.

In such examples, the first conductive layer C1, the second conductive layer C2, and the third conductive layer C3 may be arranged between the first row R1 and the second row R2, that is, the first virtual line IL1 and the second virtual line IL2 in the pair PAR of the first row R1 and the second row R2. In addition, accordingly, the first contact hole 311*c*, the second contact hole 312*c*, and the third contact hole 313*c* may be also arranged between the first row R1 and the second row R2, that is, the first virtual line IL1 and the second virtual line IL2 in the pair PAR of the first row R1 and the second row R2.

That is, the first contact hole 311*c* may be arranged more adjacent (e.g., closer) to the second portion P2 of the first portion P1 and the second portion P2 of the first pixel electrode 311, the second contact hole 312*c* may be arranged more adjacent (e.g., closer) to the third portion P3 of the third portion P3 and the fourth portion P4 of the second pixel electrode 312, and the third contact hole 313*c* may be arranged more adjacent (e.g., closer) to the fifth portion P5 of the fifth portion P5 and the sixth portion P6 of the third pixel electrode 313. In addition, the first contact hole 311*c* may be more adjacent (e.g., closer) to the third portion P3 of the third portion P3 and the fourth portion P4 of the second pixel electrode 312, and the second contact hole 312*c* may be more adjacent (e.g., closer) to the second portion P2 of the first portion P1 and the second portion P2 of the first pixel electrode 311. In addition, there are no contact holes between the pairs PAR of the first row R1 and the second row R2. Even when there are, the number of contact holes between the pairs PAR of the first row R1 and the second row R2 may be significantly less than the number of contact holes between the first row R1 and the second row R2 constituting one pair PAR.

As described above, because the contact holes are concentrated in a specific region, the thickness of the planarization layer 140 in the specific region may be less than the thickness of the planarization layer 140 in other regions. As a result, the pixel electrodes disposed on the planarization layer 140 may have an inclined shape relative to the upper surface of the substrate 100. That is, as described above, in the case of the first pixel electrode 311, the first distance between the first portion P1 and the substrate 100 may be greater than the second distance between the second portion P2 and the substrate 100. Similarly, in the case of the second pixel electrode 312, the fourth distance between the fourth portion P4 and the substrate 100 may be greater than the third distance between the third portion P3 and the substrate 100. Similarly, in the case of the third pixel electrode 313, the sixth distance between the sixth portion P6 and the substrate 100 may be greater than the fifth distance between the fifth portion P5 and the substrate 100. Here, the first to fifth distances may be measured along the z axis direction.

When the first pixel electrode 311 is inclined relative to the upper surface of the substrate 100, an approximate progression direction (e.g., emission direction) of light emitted from the first intermediate layer 321 may be a direction approximately perpendicular to the upper surface of the first pixel electrode 311, and not a direction (a z axis direction) perpendicular to the substrate 100. In addition, when the second pixel electrode 312 is inclined relative to the upper surface of the substrate 100, an approximate progression direction (e.g., emission direction) of light emitted from the second intermediate layer 322 may be a direction approximately perpendicular to the upper surface of the second pixel electrode 312, and not a direction (the z axis direction) perpendicular to the substrate 100. In addition, when the third pixel electrode 313 is inclined relative to the upper surface of the substrate 100, an approximate progression direction (e.g., emission direction) of light emitted from the third intermediate layer 323 may be a direction approximately perpendicular to the upper surface of the third pixel electrode 313, and not a direction (the z axis direction) perpendicular to the substrate 100.

However, in the display apparatus according to some embodiments, even when the first pixel electrode 311, the second pixel electrode 312, and the third pixel electrode 313 are inclined, an approximate progression direction (e.g., emission direction) of light emitted from the first intermediate layer 321, the second intermediate layer 322, and the third intermediate layer 323 may be made to be a direction (the z axis direction) perpendicular to the substrate 100. For this purpose, a first taper angle 81 of the inner surface of the first opening at a first defined portion of the pixel-defining layer 150 covering the first portion P1 of the first pixel electrode 311 may be made different from a second taper angle 82 of the inner surface of the first opening at a second defined portion of the pixel-defining layer 150 covering the second portion P2 of the first pixel electrode 311. For example, the first taper angle θ1 may be made less than (e.g., be smaller than) the second taper angle θ2.

For reference, the first taper angle θ1 may be defined as an angle between the upper surface of the first pixel electrode 311 and the inner surface of the first opening at the first defined portion of the pixel-defining layer 150 covering the first portion P1 of the first pixel electrode 311. Likewise, the second taper angle θ2 may be defined as an angle between the upper surface of the first pixel electrode 311 and the inner surface of the first opening at the second defined portion of the pixel-defining layer 150 covering the second portion P2 of the first pixel electrode 311. In other words, the first and second taper angles θ1 and θ2 may be defined between the bottom surface of the first intermediate layer 321 and the top surface of the first pixel electrode 311 at the first and second portions P1 and P2, respectively.

When a taper angle of the inner surface of the pixel-defining layer having the opening exposing the central portion of the pixel electrode is constant, light emitted from the emission layer on the pixel electrode progresses in a direction approximately perpendicular to the upper surface of the pixel electrode. When a taper angle at a specific portion of the pixel-defining layer is less than a taper angle at another portion, light emitted from the emission layer on the pixel electrode progresses in a direction that is not approximately perpendicular to the upper surface of the pixel electrode but is biased toward the specific portion.

As described above, in the case of the first pixel electrode 311, because the first distance between the first portion P1 and the substrate 100 is greater than the second distance between the second portion P2 and the substrate 100, the first taper angle θ1 of the inner surface of the first opening at the first defined portion of the pixel-defining layer 150 covering the first portion P1 of the first pixel electrode 311 may be made less than (e.g., be smaller than) the second taper angle θ2 of the inner surface of the first opening at the second defined portion of the pixel-defining layer 150 covering the second portion P2 of the first pixel electrode 311. Accordingly, light emitted from the emission layer on the first pixel electrode 311 may progress (e.g., be emitted) in a direction (the z axis direction) approximately perpendicular to the substrate 100, and not in a direction perpendicular to the upper surface of the first pixel electrode 311.

Similarly, in the case of the second pixel electrode 312, because the fourth distance between the fourth portion P4 and the substrate 100 is greater than the third distance between the third portion P3 and the substrate 100, a fourth taper angle 64 of the inner surface of the second opening at a fourth defined portion of the pixel-defining layer 150 covering the fourth portion P4 of the second pixel electrode 312 may be made less than (e.g., be smaller than) a third taper angle 63 of the inner surface of the second opening at a third defined portion of the pixel-defining layer 150 covering the third portion P3 of the second pixel electrode 312. Accordingly, light emitted from the emission layer on the second pixel electrode 312 may progress (e.g., be emitted) in a direction (the z axis direction) approximately perpendicular to the substrate 100, and not in a direction perpendicular to the upper surface of the second pixel electrode 312.

For reference, the third taper angle 63 may be defined as an angle between the upper surface of the second pixel electrode 312 and the inner surface of the second opening at the third defined portion of the pixel-defining layer 150 covering the third portion P3 of the second pixel electrode 312. Likewise, the fourth taper angle 64 may be defined as an angle between the upper surface of the second pixel electrode 312 and the inner surface of the second opening at the fourth defined portion of the pixel-defining layer 150 covering the fourth portion P4 of the second pixel electrode 312. In other words, the third and fourth taper angles 63 and 64 may be defined between the bottom surface of the second intermediate layer 322 and the top surface of the second pixel electrode 312 at the third and fourth portions P3 and P4, respectively.

Similarly, in the case of the third pixel electrode 313, because the sixth distance between the sixth portion P6 and the substrate 100 is greater than the fifth distance between the fifth portion P5 and the substrate 100, a sixth taper angle 66 of the inner surface of the third opening at a sixth defined portion of the pixel-defining layer 150 covering the sixth portion P6 of the third pixel electrode 313 may be made less than (e.g., be smaller than) a fifth taper angle 65 of the inner surface of the third opening at a fifth defined portion of the pixel-defining layer 150 covering the fifth portion P5 of the third pixel electrode 313. Accordingly, light emitted from the emission layer on the third pixel electrode 313 may progress in a direction (the z axis direction) approximately perpendicular to the substrate 100, and not in a direction perpendicular to the upper surface of the third pixel electrode 313.

For reference, the fifth taper angle 65 may be defined as an angle between the upper surface of the third pixel electrode 313 and the inner surface of the third opening at the fifth defined portion of the pixel-defining layer 150 covering the fifth portion P5 of the third pixel electrode 313. Likewise, the sixth taper angle 66 may be defined as an angle between the upper surface of the third pixel electrode 313 and the inner surface of the third opening at the sixth defined portion of the pixel-defining layer 150 covering the sixth portion P6 of the third pixel electrode 313.

In other words, the fifth and sixth taper angles 65 and 66 may be defined between the bottom surface of the third intermediate layer 323 and the top surface of the third pixel electrode 313 at the fifth and sixth portions P5 and P6, respectively.

To adjust the taper angle of the pixel-defining layer 150, as shown in FIG. 3, when viewed in a direction (the z axis direction) perpendicular to the substrate 100 (e.g., when viewed in a plan view), one of the first portion P1 and the second portion P2 of the first pixel electrode 311 may have a portion that adjoins the first opening of the pixel-defining layer 150 and has a round shape. For example, the first portion P1 of the first pixel electrode 311 may have a portion that adjoins the first opening of the pixel-defining layer 150 and has a round shape. In addition, when viewed in a direction (the z axis direction) perpendicular to the substrate 100, the second portion P2 of the first pixel electrode 311 may have a portion that adjoins the first opening of the pixel-defining layer 150 and has a straight line shape or an angled shape.

When forming the first opening of the pixel-defining layer 150, in a plan view viewed in a direction (the z axis direction) perpendicular to the substrate 100, a taper angle of a portion having an angled shape, that is, a sharp portion of the edge of the first opening becomes relatively large, and a taper angle of a portion having a curved, round shape of the edge of the first opening becomes small. A taper angle of a portion having a straight line shape of the edge of the first opening is less than a taper angle of a portion having an angled shape, but becomes larger (e.g., is greater) than a taper angle of a portion having a curved, round shape. Accordingly, when viewed in a direction (the z axis direction) perpendicular to the substrate 100, because the first portion P1 of the first pixel electrode 311 has a portion that adjoins the first opening of the pixel-defining layer 150 and has a round shape and the second portion P2 of the first pixel electrode 311 has a portion that adjoins the first opening of the pixel-defining layer 150 and has an angled shape, the first taper angle 81 of the inner surface at the first defined portion of the pixel-defining layer 150 covering the first portion P1 of the first pixel electrode 311 may be made less than (e.g., be smaller than) the second taper angle 82 of the inner surface at the second defined portion of the pixel-defining layer 150 covering the second portion P2 of the first pixel electrode 311.

Likewise, when viewed in a direction (the z axis direction) perpendicular to the substrate 100, the fourth portion P4 of the second pixel electrode 312 may have a portion that adjoins the second opening of the pixel-defining layer 150 and has a round shape, and the third portion P3 of the second pixel electrode 312 may have a portion that adjoins the second opening of the pixel-defining layer 150 and has a straight line shape or an angled shape. Through this, the fourth taper angle θ4 of the inner surface at the fourth defined portion of the pixel-defining layer 150 covering the fourth portion P4 of the second pixel electrode 312 may be made less than (e.g., be smaller than) the third taper angle θ3 of the inner surface at the third defined portion of the pixel-defining layer 150 covering the third portion P3 of the second pixel electrode 312.

In addition, when viewed in a direction (the z axis direction) perpendicular to the substrate 100, the sixth portion P6 of the third pixel electrode 313 may have a portion that adjoins the third opening of the pixel-defining layer 150 and has a round shape, and the fifth portion P5 of the third pixel electrode 313 may have a portion that adjoins the third opening of the pixel-defining layer 150 and has a straight line shape or an angled shape. Through this, the sixth taper angle 66 of the inner surface at the sixth defined portion of the pixel-defining layer 150 covering the sixth portion P6 of the third pixel electrode 313 may be made less than (e.g., be smaller than) the fifth taper angle 65 of the inner surface at the fifth defined portion of the pixel-defining layer 150 covering the fifth portion P5 of the third pixel electrode 313.

Figure 5:
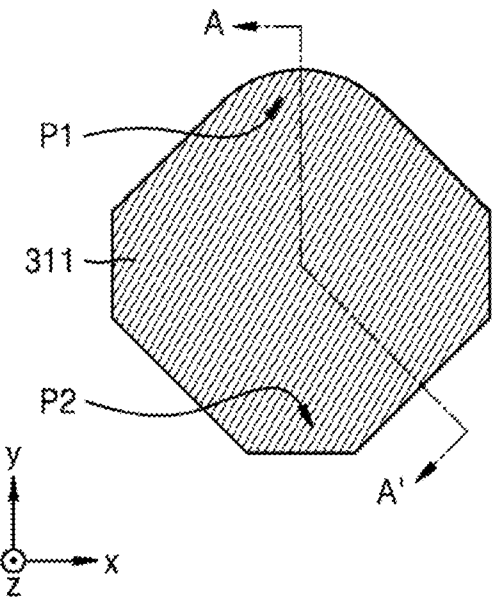
FIG. 5 is a schematic plan view of a portion of a display apparatus according to some embodiments of the present disclosure.

FIG. 5 is a schematic plan view of a portion of the display apparatus according to some embodiments of the present disclosure and schematically shows a portion of the first pixel electrode 311 not covered by the pixel-defining layer 150. As shown in FIG. 5, a portion of the first pixel electrode 311 not covered by the pixel-defining layer 150 has a chamfered rhombic shape as a whole. Among the first portion P1 and the second portion P2 arranged on two opposite sides in the second direction (the y axis direction), the first portion P1 may have a round shape and the second portion P2 may have an angled shape. Through this, the first taper angle θ1 of the inner surface of the pixel-defining layer 150 covering the first portion P1 of the first pixel electrode 311 may be made less than (e.g., be smaller than) the second taper angle θ2 of the inner surface of the pixel-defining layer 150 covering the second portion P2 of the first pixel electrode 311.

Figure 6:
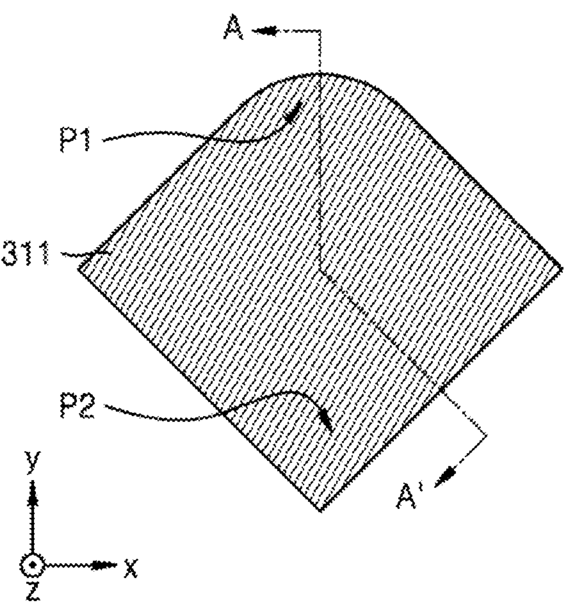
FIG. 6 is a schematic plan view of a portion of a display apparatus according to some embodiments of the present disclosure.

FIG. 6 is a schematic plan view of a portion of the display apparatus according to some embodiments of the present disclosure and schematically shows a portion of the first pixel electrode 311 not covered by the pixel-defining layer 150. As shown in FIG. 6, a portion of the first pixel electrode 311 not covered by the pixel-defining layer 150 has a rhombic shape as a whole. Among the first portion P1 and the second portion P2 arranged on two opposite sides in the second direction (the y axis direction), the first portion P1 may have a round shape and the second portion P2 may have an angled shape. Through this, the first taper angle θ1 of the inner surface of the pixel-defining layer 150 covering the first portion P1 of the first pixel electrode 311 may be made less than (e.g., be smaller than) the second taper angle θ2 of the inner surface of the pixel-defining layer 150 covering the second portion P2 of the first pixel electrode 311.

Figure 7:
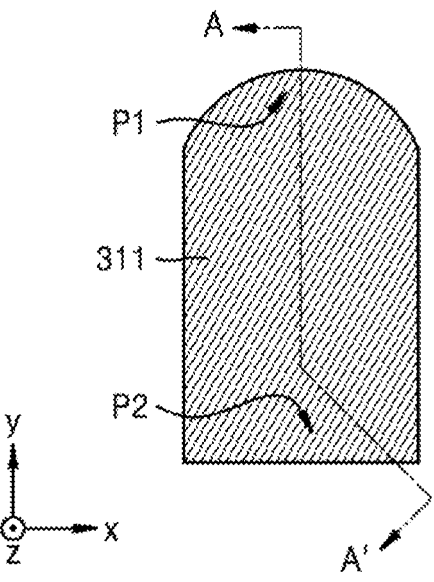
FIG. 7 is a schematic plan view of a portion of a display apparatus according to some embodiments of the present disclosure.

FIG. 7 is a schematic plan view of a portion of the display apparatus according to some embodiments of the present disclosure and schematically shows a portion of the first pixel electrode 311 not covered by the pixel-defining layer 150. As shown in FIG. 7, a portion of the first pixel electrode 311 not covered by the pixel-defining layer 150 has a rectangular shape as a whole. Among the first portion P1 and the second portion P2 arranged on two opposite sides in the second direction (the y axis direction), the first portion P1 may have a round shape and the second portion P2 may have a straight line shape. Through this, the first taper angle θ1 of the inner surface of the pixel-defining layer 150 covering the first portion P1 of the first pixel electrode 311 may be made less than (e.g., be smaller than) the second taper angle θ2 of the inner surface of the pixel-defining layer 150 covering the second portion P2 of the first pixel electrode 311.

According to some embodiments, the display apparatus that displays high-quality images is implemented. However, the scope of the disclosure is not limited by this effect.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept. In addition, an upper surface may be referred to as a top surface.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", "in contact with", "in direct contact with", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. A display apparatus comprising:

a substrate;

a first pixel electrode over the substrate, wherein a first distance between a first portion of the first pixel electrode and the substrate is different from a second distance between a second portion of the first pixel electrode and the substrate; and a pixel-defining layer covering a portion of the first pixel electrode and having a first opening exposing a central portion of the first pixel electrode, wherein a first taper angle of an inner surface of the first opening at a first defined portion of the pixel-defining layer covering the first portion is different from a second taper angle of an inner surface of the first opening at a second defined portion of the pixel-defining layer covering the second portion.

2. The display apparatus of claim 1, wherein the first distance is greater than the second distance, and the first taper angle is less than the second taper angle.

3. The display apparatus of claim 2, further comprising:

a first conductive layer; and an insulating layer between the first conductive layer and the first pixel electrode, wherein the first pixel electrode is electrically connected to the first conductive layer through a first contact hole of the insulating layer, and the first contact hole is closer to the second portion than the first portion.

4. The display apparatus of claim 1, wherein the first and second portions are at opposite sides of the first pixel electrode with respect to a center of the first pixel electrode.

5. The display apparatus of claim 1, wherein, when viewed in a direction perpendicular to the substrate, a portion of one of the first portion and the second portion adjoining the first opening has a round shape.

6. The display apparatus of claim 1, wherein the first distance is greater than the second distance, and the first taper angle is less than the second taper angle, and wherein, when viewed in a direction perpendicular to the substrate, a portion of the first portion adjoining the first opening has a round shape.

7. The display apparatus of claim 6, wherein, when viewed in the direction perpendicular to the substrate, a portion of the second portion adjoining the first opening has a straight line shape or an angled shape.

8. The display apparatus of claim 1, further comprising:

a second pixel electrode on the substrate, wherein a third distance between a third portion of the second pixel electrode and the substrate is different from a fourth distance between a fourth portion of the second pixel electrode and the substrate, wherein the pixel-defining layer covers a portion of the second pixel electrode and has a second opening exposing a central portion of the second pixel electrode, and wherein a third taper angle of an inner surface of the second opening at a third defined portion of the pixel-defining layer covering the third portion is different from a fourth taper angle of an inner surface of the second opening at a fourth defined portion of the pixel-defining layer covering the fourth portion.

9. The display apparatus of claim 8, wherein the first and second portions are at opposite sides of the first pixel electrode with respect to a center of the first pixel electrode, and the third and fourth portions are at opposite sides of the second pixel electrode with respect to a center of the second pixel electrode.

10. The display apparatus of claim 8, wherein, when viewed in a direction perpendicular to the substrate, a portion of one of the first portion and the second portion adjoining the first opening has a round shape, and a portion of one of the third portion and the fourth portion adjoining the second opening has a round shape.

11. The display apparatus of claim 8, wherein the first distance is greater than the second distance, the first taper angle is less than the second taper angle, the fourth distance is greater than the third distance, and the fourth taper angle is less than the third taper angle, and wherein, when viewed in a direction perpendicular to the substrate, a portion of the first portion adjoining the first opening has a round shape, and a portion of the fourth portion adjoining the second opening has a round shape.

12. The display apparatus of claim 11, wherein, when viewed in the direction perpendicular to the substrate, a portion of the second portion adjoining the first opening has a straight line shape or an angled shape, and a portion of the third portion adjoining the second opening has a straight line shape or an angled shape.

13. The display apparatus of claim 8, wherein the first distance is greater than the second distance, the first taper angle is less than the second taper angle, the fourth distance is greater than the third distance, and the fourth taper angle is less than the third taper angle.

14. The display apparatus of claim 13, further comprising:

a first conductive layer and a second conductive layer positioned on a same layer; and an insulating layer covering the first conductive layer and the second conductive layer, wherein the first pixel electrode and the second pixel electrode are on the insulating layer, the first pixel electrode is electrically connected to the first conductive layer through a first contact hole of the insulating layer, the second pixel electrode is electrically connected to the second conductive layer through a second contact hole of the insulating layer, and wherein the first contact hole is closer to the second portion than the first portion, and the second contact hole is closer to the third portion than the fourth portion.

15. The display apparatus of claim 14, wherein the first contact hole is closer to the third portion than the fourth portion, and the second contact hole is closer to the second portion than the first portion.

16. The display apparatus of claim 14, wherein the second portion is a portion of the first pixel electrode in a direction toward the second pixel electrode, and the third portion is a portion of the second pixel electrode in a direction toward the first pixel electrode.

17. The display apparatus of claim 13, further comprising:

a third pixel electrode over the substrate, a fifth distance between a fifth portion of the third pixel electrode and the substrate is less than a sixth distance between a sixth portion of the third pixel electrode and the substrate;

a first conductive layer, a second conductive layer, and a third conductive layer, on a same layer and sequentially arranged in a first direction; and an insulating layer covering the first conductive layer, the second conductive layer, and the third conductive layer, wherein the first pixel electrode, the second pixel electrode, and the third pixel electrode are on the insulating layer, wherein the first pixel electrode is electrically connected to the first conductive layer through a first contact hole of the insulating layer, the second pixel electrode is electrically connected to the second conductive layer through a second contact hole of the insulating layer, and the third pixel electrode is electrically connected to the third conductive layer through a third contact hole of the insulating layer, and wherein the first contact hole is closer to the second portion than the first portion, the second contact hole is closer to the third portion than the fourth portion, and the third contact hole is closer to the fifth portion among the fifth portion and the sixth portion.

18. The display apparatus of claim 17, wherein a first virtual line connecting a center of the first pixel electrode to a center of the third pixel electrode extends in the first direction, and a center of the second pixel electrode is located in a second direction perpendicular to the first direction with respect to the first virtual line, and wherein the first contact hole, the second contact hole, and the third contact hole are located between the first virtual line and a second virtual line passing through the center of the second pixel electrode and parallel to the first virtual line.

19. A display apparatus comprising:

first pixel electrodes and third pixel electrodes alternately arranged in a first row extending in a first direction;

second pixel electrodes arranged in a second row extending in the first direction;

first conductive layers, second conductive layers, and third conductive layers arranged between the first row and the second row, the first conductive layers corresponding to the first pixel electrodes, the second conductive layers corresponding to the second pixel electrodes, and the third conductive layers corresponding to the third pixel electrodes;

an insulating layer covering the first conductive layers, the second conductive layers, and the third conductive layers; and a pixel-defining layer covering the first pixel electrodes, the second pixel electrodes, and the third pixel electrodes, and comprising first openings exposing central portions of the first pixel electrodes, second openings exposing central portions of the second pixel electrodes, and third openings exposing central portions of the third pixel electrodes, wherein the first pixel electrodes, the second pixel electrodes, and the third pixel electrodes are on the insulating layer, wherein the first pixel electrodes are electrically connected to the first conductive layers through first contact holes of the insulating layer, the second pixel electrodes are electrically connected to the second conductive layers through second contact holes of the insulating layer, and the third pixel electrodes are electrically connected to the third conductive layers through third contact holes of the insulating layer, and wherein, in a second direction perpendicular to the first direction, a second taper angle at a portion of an inner surface of each of the first openings in a direction toward the second row is different from a first taper angle at a portion in a direction away from of the second row, a fifth taper angle at a portion of an inner surface of each of the third openings in a direction toward the second row is different from a sixth taper angle at a portion in a direction away from the second row, and a third taper angle at a portion of an inner surface of each of the second openings in a direction toward the first row is different from a fourth taper angle at a portion in a direction away from the first row.

20. The display apparatus of claim 19, wherein the first taper angle is less than the second taper angle, the sixth taper angle is less than the fifth taper angle, and the fourth taper angle is less than the third taper angle.

* * * * *